US007459702B2

(12) United States Patent
Neogi et al.

(10) Patent No.: US 7,459,702 B2
(45) Date of Patent: Dec. 2, 2008

(54) APPARATUS AND METHOD FOR POLISHING GEMSTONES AND THE LIKE

(76) Inventors: Jayant Neogi, 33038 Esser Ct., Temecula, CA (US) 92592; Suneeta Neogi, 33038 Esser Ct., Temecula, CA (US) 92592

( * ) Notice: Subject to any disclaimer, the term of this patent is extended or adjusted under 35 U.S.C. 154(b) by 283 days.

(21) Appl. No.: 11/259,840

(22) Filed: Oct. 26, 2005

(65) Prior Publication Data
US 2006/0102854 A1 May 18, 2006

Related U.S. Application Data

(60) Provisional application No. 60/623,129, filed on Oct. 26, 2004.

(51) Int. Cl.
*H01J 37/30* (2006.01)
(52) U.S. Cl. .............. 250/492.2; 250/492.21; 250/492.3
(58) Field of Classification Search ............. 250/492.2; 427/9, 249.8; 438/200, 692
See application file for complete search history.

(56) References Cited

U.S. PATENT DOCUMENTS

| | | | |
|---|---|---|---|
| 5,707,409 A * | 1/1998 | Martin et al. ............ 51/295 |
| 6,197,375 B1 * | 3/2001 | Graebner et al. ........ 427/249.8 |
| 6,537,606 B2 * | 3/2003 | Allen et al. .............. 427/9 |
| 6,750,460 B2 * | 6/2004 | Greer ..................... 250/492.2 |
| 7,060,620 B2 * | 6/2006 | Richtarch ............... 438/692 |
| 7,238,088 B1 * | 7/2007 | Genis et al. ............. 451/57 |
| 2003/0109092 A1 * | 6/2003 | Choi et al. .............. 438/200 |
| 2007/0125747 A1 * | 6/2007 | Otsuka et al. ........... 216/66 |

* cited by examiner

*Primary Examiner*—Nikita Wells
*Assistant Examiner*—Johnnie L Smith, II
(74) *Attorney, Agent, or Firm*—Marger Johnson & McCollom, P.C.

(57) ABSTRACT

The invention comprises a two-step process for achieving an ultra-polish finish on materials such as gemstones and the like by first performing a chemical-mechanical polishing of the material using an intermetallic material as the grinding medium followed by a gas cluster ion beam (GCIB) treatment. The intermetallic grinding wheel is formed of carbide-forming metals in the form of intermetallics consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W. The gas cluster ion beams are comprised of gas clusters having nano-sized aggregates of materials that are gaseous under conditions of standard temperature and pressure. Such clusters can be ionized by electron bombardment or other means, permitting the gas clusters to be formed into directed beams of known and controllable energy. The larger sized gas clusters are the most useful because the larger sized gas clusters are able to carry substantial energy per cluster ion, while yet having only modest energy per atom or molecule.

29 Claims, 9 Drawing Sheets

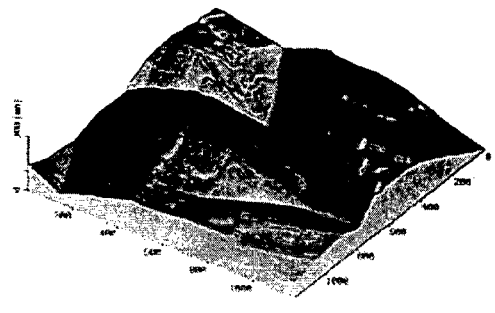
Ra = 428Å
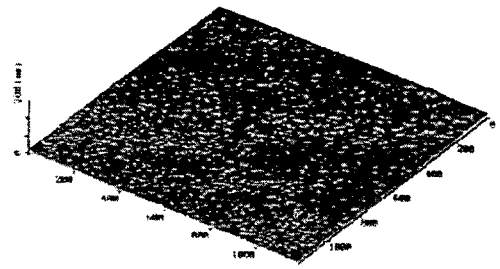
Ra = 24Å
1 μm square scan
FIG. 6A    FIG. 6B
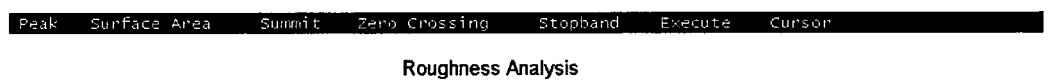
Roughness Analysis
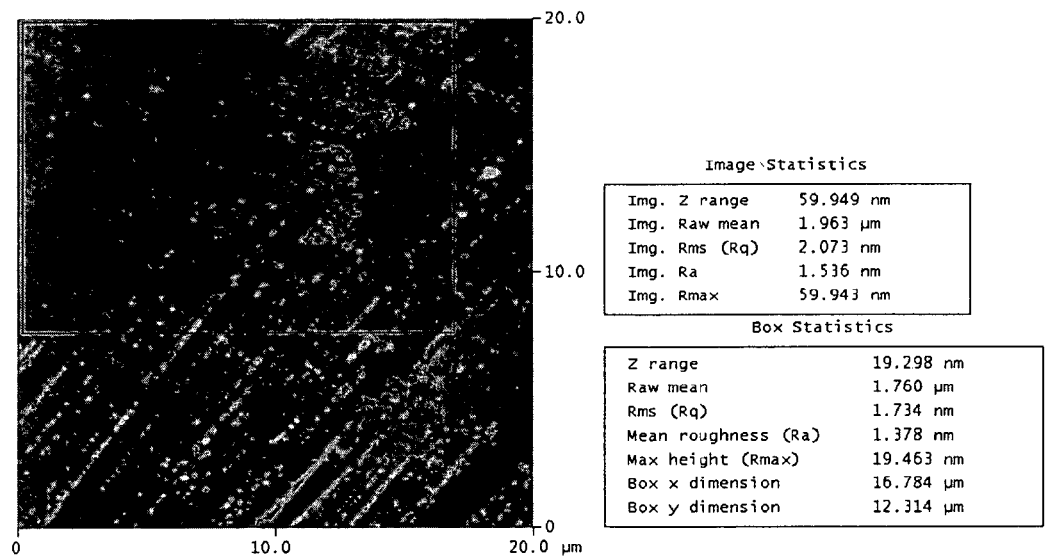
FIG. 7

APPARATUS AND METHOD FOR POLISHING GEMSTONES AND THE LIKE

CROSS-REFERENCES TO RELATED APPLICATIONS

This application claims the benefit from U.S. Provisional Patent Application No. 60/623,129 filed Oct. 26, 2004 whose contents are incorporated herein for all purposes.

BACKGROUND OF THE INVENTION

1. Field of the Invention

This invention relates generally to gemstone polishing processes and an apparatus for effecting such methods, and more particularly to methods for effecting ultra-polishing, cleaning, planarization and/or deposition of angstrom level coatings on natural/synthetic single or polycrystalline diamonds and gemstones, chemical vapor deposited diamonds, precious metals and other durable materials for the purpose of producing a final surface finish at sub-nanometer level of roughness and modification of surface properties. The ultra-polish technique described in this invention may also be applied to metallographic and semiconductor device sample preparation to enable the microscopic examination of surfaces for characterization of structure and chemical properties.

2. Description of the Prior Art

The high cost of gemstones, and particularly diamonds, owes to their rarity in nature, their difficulty in mining, and their cost for finishing. Currently accepted techniques for planarizing and polishing gem quality diamonds, for instance, utilize a grinding and polishing tool that is somewhat inefficient, with the final polishing result heavily dependant on the skill of the operator using the grinding tool. In addition, the surface planarity and surface polish quality is dependant on the diamond powder size and the properties of the grinding wheel.

Polishing is often necessary as a post-processing step after the raw gemstone is cut to form the finished stone. In the gem trade as well as in the manufacturing of industrial diamond products, cleavage has more or less been replaced by sawing. Sawing is carried out by pressing a single diamond crystal against a thin, rotating ($\sim 10^4$ turns/minute) phosphor-bronze wheel with an edge impregnated by a mixture of diamond powder and oil. In general sawing is carried out along the {110} and {100} planes. Sawn diamond surfaces show numerous sawing grooves that need subsequent polishing.

Under conventional processes, diamond is polished by pressing a crystal against the surface of a rotating cast-iron wheel, or scaife, charged with a mixture of diamond powder and oil. The scaife rotates at high speed (50 m/s) with the diamond facet to be polished being pushed against the scaife under 10-25 kg/mm² pressure. This method has been used for planarizing and polishing gem quality diamonds; however, its processing efficiency is extremely low and the ability to achieve a desired surface finish is limited.

Another characteristic of processing using a scaife is that the rate of material removed using diamond polishing varies strongly with crystal orientation. Such a characteristic has contributed to the complexity of achieving a uniform high quality of polish across all crystal planes. For instance, the polishing rate for {110} and {100} faces along the 'soft' directions <100> is two to three orders of magnitude higher than the 'hard' directions <110>. The {111} plane is abrasion resistant in all directions. However, the use of the diamond powder as an abrasive leads to material removal on {111} planes by micro-fracture at a very slow polishing rate. Polishing along the 'soft' directions is thought to proceed via the transformation of $sp^3$ hybridized carbon (diamond) to a less dense form of carbon ($sp^2$ hybridized) which detaches itself from the diamond. Scanning tunneling microscope (STM) topography shows that polished diamond surfaces (polished along 'soft' directions) are rough on a nanometer scale, and are covered by grooves, 20 to 100 nm wide and 4 to 12 nm deep. By lateral movement of the diamond during polishing, the roughness of polished facets on single crystals achieved by mechanical polishing can be as low as 1 nm for {110} plane and 2 nm for {100} plane. Polishing in the hard <111> direction occurs by fracture and chipping but no cleaving in the nano-scale range, thus resulting roughness of the surface obtained is significantly higher. Achieving this level of polish finish requires extreme skill, and is very time consuming in addition to imposing repeated re-conditioning of the scaife. Thus, polishing a gem quality diamond requires such great skill where polishing is carried out while examining the crystallographic planes and orientation to locate the plane to be possibly polished. This has led to making diamond polishing complicated and expensive.

Other drawbacks to current polishing techniques involve the grinding material itself. As described above, a diamond is so hard a material that it is generally believed that there is no substitute for it; therefore, it is only natural to consider that there is no abrasive for diamond except diamond itself (i.e., grinding and polishing using diamond). Thus, grinders have been devised for polishing diamonds in which a diamond abrasive embedded in different kinds of binders are used for grinding and polishing. Examples of such grinders include a resin bonded diamond wheel utilizing phenol resin, a metal bonded diamond wheel, a vitrified bonded diamond wheel utilizing feldspar/quartz, and an electroplated diamond grinding wheel.

Polishing problems are not limited to diamonds. The methods used for sample preparation of metallographic sections, semiconductor device sections and other materials are typically a combination of one or more techniques involving mechanical grinding and polishing using a variety of abrasive media and/or focused ion beam polishing. Mechanical methods are time consuming although there have been major advances in automation and control. Focused ion beam polishing makes it possible to polish small regions with the ability to precisely reach the plane of interest. But surface and sub-surface damage due to implantation and use of energetic monomer ions is inevitable.

Another technology for treating surfaces is using energetic-ion sputtering for etching and thinning in manufacturing and depth-profiling in analytic instruments. However, energetic-ion sputtering causes subsurface damage and accumulated roughness because energetic-ion sputtering uses monomer ions. Individual monomer atoms or molecules have energies on the order of thousands of electron volts that can cause residual surface damage to the material being polished.

Accordingly, the need remains for an improved method for polishing surfaces such as diamonds, gemstones, and other materials that overcomes some of the drawbacks that exist in the prior art.

SUMMARY OF THE INVENTION

The invention comprises a two-step process for achieving an ultra-polish finish on materials such as gemstones and the like by first performing a chemical-mechanical polishing of the material using an intermetallic material as the grinding medium followed by a gas cluster ion beam (GCIB) treatment. The intermetallic chemical-mechanical polishing and GCIB treatment are themselves each an improvement in the art and can be used separately, but preferable polishing is accomplished through a combination of both processes.

The intermetallic grinding wheel constructed and used according to the invention is preferably formed of carbide-forming metals in the form of intermetallics consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W.

Gas cluster ion beam (GCIB) is a beam-based process for achieving planarization and ultra-polish which, especially when combined with the intermetallic chemical-mechanical polishing technique disclosed above, overcomes the limitations of current techniques in terms of quality of polish achieved, and anisotropy of mechanical polishing technique where all planes can be polished equally and there is no distinction regarding polishing directions as in the mechanical polishing process. Throughput time is therefore increased while the chance for human errors or dependencies is decreased.

Gas cluster ion beams are used for etching, cleaning and smoothing (polishing) of diamonds, gemstones and precious metals. The gas cluster ion beams are comprised of gas clusters having nano-sized aggregates of materials that are gaseous under conditions of standard temperature and pressure. One characteristic of gas cluster ion interactions with surfaces is ultra-shallow interaction depth. The gas cluster ion interaction also exhibits inherent smoothing and planarizing behaviors. These behaviors can be extraordinary when the gas cluster ion impacts upon rough or non-planar substrates (diamond, gemstone or precious metal). Since the atoms within a cluster are able to interact with each other as the cluster disintegrates upon impact, some of the energy carried by the cluster is converted into energy of individual atoms within the cluster. This converted energy is dissipated in all directions within the plane of the target substrate (diamond, gemstone, precious metals or other materials), thereby producing excellent smoothing (polishing) behavior.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIGS. 6A and 6B are scanned images showing polishing and planarization of polycrystalline diamonds before and after, respectively, using the GCIB treatment according to the invention.

FIG. 7 is an atomic force microscope (AFM) scanned image before GCIB processing of a single crystal diamond.

DETAILED DESCRIPTION OF THE INVENTION

Figure 1:
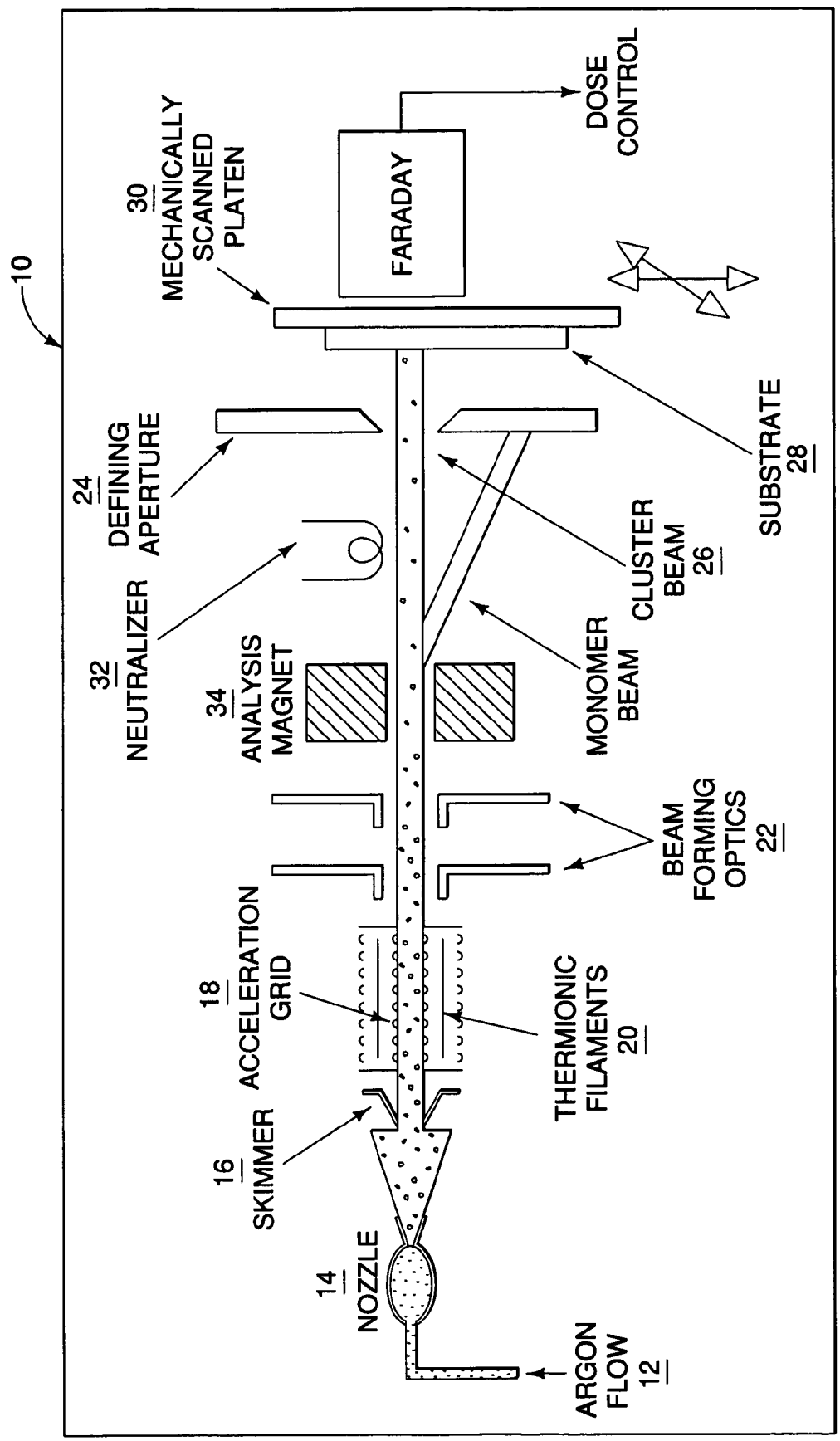
FIG. 1 is schematic diagram of a gas cluster ion beam (GCIB) apparatus operable to force a source gas through a nozzle at high pressure to form atomic or molecular clusters for impact against a material to be polished according to methods of the invention.

Overcoming the anisotropy of mechanical-based polishing process is one of the key factors of intermetallic chemical-mechanical polishing and GCIB treatment of gemstones and the like. Whereas the use of a polishing scaife is very time and labor intensive, taking hours or even days to obtain a satisfactory polish level, GCIB treatment, as performed using methods taught in the present invention using apparatus disclosed herein, can batch process a few thousands of diamonds at a time taking only on the order of minutes to process the entire lot while achieving sub-nanometer level surface finish. This level of surface finish is currently not achievable with the scaife method for diamonds for all planes and directions.

The invention further details a production process for polishing of diamonds (natural and artificial), gemstones (sapphire, emeralds, ruby and other soft gemstone which are hard to polish), and precious/durable metals using gas cluster ion beam (GCIB) processing.

This technique is also applicable as a final planarizing step, removal of implantation damage and polishing step in sample preparation of metallographic sections, semiconductor device sections and other materials where elimination of surface and sub-surface damage is critical.

According to a preferred embodiment of the invention, gas cluster ion beams can be used for etching, cleaning and smoothing (polishing) of diamonds, gemstones and precious metals. The gas cluster ion beams are comprised of gas clusters having nano-sized aggregates of materials that are gaseous under conditions of standard temperature and pressure. Such clusters can be ionized by electron bombardment or other means, permitting the gas clusters to be formed into directed beams of known and controllable energy. The larger sized gas clusters are the most useful because the larger sized gas clusters are able to carry substantial energy per cluster ion, while yet having only modest energy per atom or molecule.

The gas clusters disintegrate upon impact, resulting in each individual atom or molecule carrying only a small fraction of the total cluster energy. Consequently, the impact effects of large clusters, while substantial, are limited to only a very shallow surface region, thereby enabling ion clusters to be effective for a variety of surface modification processes, without the tendency to produce deeper subsurface damage. The deeper subsurface damage is a characteristic of monomer or molecular ion beam processing.

One characteristic of gas cluster ion interactions with surfaces is ultra-shallow interaction depth. The gas cluster ion interaction also exhibits inherent smoothing and planarizing behaviors. These behaviors can be extraordinary when the gas cluster ion impacts upon rough or non-planar substrates (e.g., diamond, gemstone or precious metal). Since the atoms within a cluster are able to interact with each other as the cluster disintegrates upon impact, some of the energy carried by the cluster is converted into energy of individual atoms within the cluster. This converted energy is dissipated in all directions within the plane of the target substrate (diamond, gemstone, precious metals or other materials), thereby producing excellent smoothing (polishing) behavior.

Gas cluster ions deposit their total energy into the impact site upon the target surface. The atoms within a gas cluster ion have small individual energies that prevent the atoms from penetrating beyond very shallow depths of a few atomic layers. Consequently, a gas cluster ion deposits considerable energy into a much shallower region on the target surface than would a monomer or molecular ion of equal energy. Similarly, since the gas cluster ion has much greater mass and momentum, a gas cluster ion impact can generate much more intense bombardment.

Impact of a gas cluster ion upon a solid surface produces a number of unique effects. The effects are associated with:

The large total energy of the cluster;

The small energies of the individual atoms within the cluster; and

Unusual atomic interaction phenomena which occur as the cluster disintegrates.

Effects that are produced by the gas cluster ions have great potential for atomic scale processing of diamonds, gemstones, precious metals and other materials.

Computer simulation of gas cluster ion impacts predict peak momentary temperatures of the order of 100,000°K in combination with pressure pulses in the range of millions of pounds per square inch. These transient high temperature and pressure conditions within the impact volume occur while the gas atoms from the cluster are being dynamically mixed with the target material atoms, thereby enabling highly enhanced chemical reaction properties to be observed or realized.

Attention will first be drawn to the gas cluster ion beam treatment methods and apparatus and then proceed to those of using the intermetallic-based chemical-mechanical diamond polishing wheel.

I. Gas Cluster Ion Beam (GCIB) Formation

The impact morphology and kinetics of an atomic or molecular cluster ion impinging on a surface has been found to be quite different from that of monomer ions composing a broad or focused ion beam impinging upon a target. Formed in vacuum through a Venturi nozzle (FIG. 1), van der Waals forces may hold anywhere from 500 to 5,000 atoms of a source gas together. Ionizing the gas cluster provides a given cluster of atoms with a single shared charge. With 5-80 keV acceleration to a target surface, the energy of acceleration of the cluster upon surface impingement is divided between all the atoms of the cluster. With this division of energy, an individual atom belonging to the cluster that accelerated through 5-80 keV imparts an equivalent energy of that of a monomer ion accelerated through a few eV.

The general GCIB apparatus schematic is shown in FIG. 1 at 10. The apparatus comprises a source of gas characterized by argon flow 12 passing through Venturi nozzle 14. A skimmer 16 is positioned in front of nozzle 14 to admit therethrough only clusters moving linearly in the same direction. The linearized cluster stream is then passed through an acceleration grid 18 including thermionic filaments 20 where an acceleration energy is imparted to the stream and, together with optics 22 and defining aperture 24, form an gas cluster ionized beam 26. The substrate 28 is mounted on a platen 30 (or a gemstone within a holder) within the impact path of beam 26. An analysis magnet 34 and neutralizer 32 co-act to filter out undesired monomer beams formed through the process by redirecting them for impact against defining aperture 24 so that such monomer beams and particles do not impact substrate 28 and negatively affect the morphology thereby.

The FARADAY cup as it is termed is a device used to measure the beam current which is then used to calculate the dose. This measurement is performed by moving aside the sample platen and allowing the beam to pass through the defining aperture and impinge upon the faraday cup. The beam current registered by the Faraday cup is used to calculate the dose being delivered by the beam using the following relationship:

Dose "$D$"=$(I \times t)/qA$, where

I=beam current registered by faraday cup {I is in ampere which is the SI base unit of electrical current and is equal to coulombs per second} t=Dwell time of the beam $q=1.6 \times 10^{-19}$ C {C=coulomb which is the unt of charge}

A=area

Figure 2A:
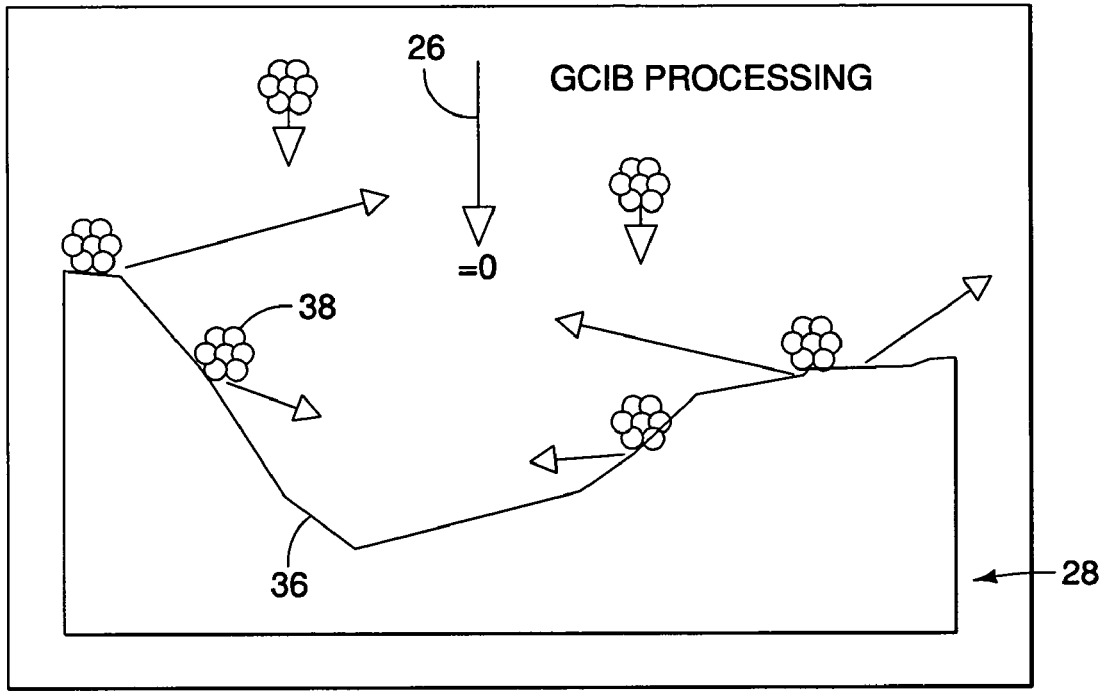
FIGS. 2A and 2B illustrate the effects of the lateral sputtering surface smoothing mechanism used in the GCIB apparatus of FIG. 1 to decrease in proportion to cos Φ, where Φ is the gas cluster incidence angle.
Figure 2B:
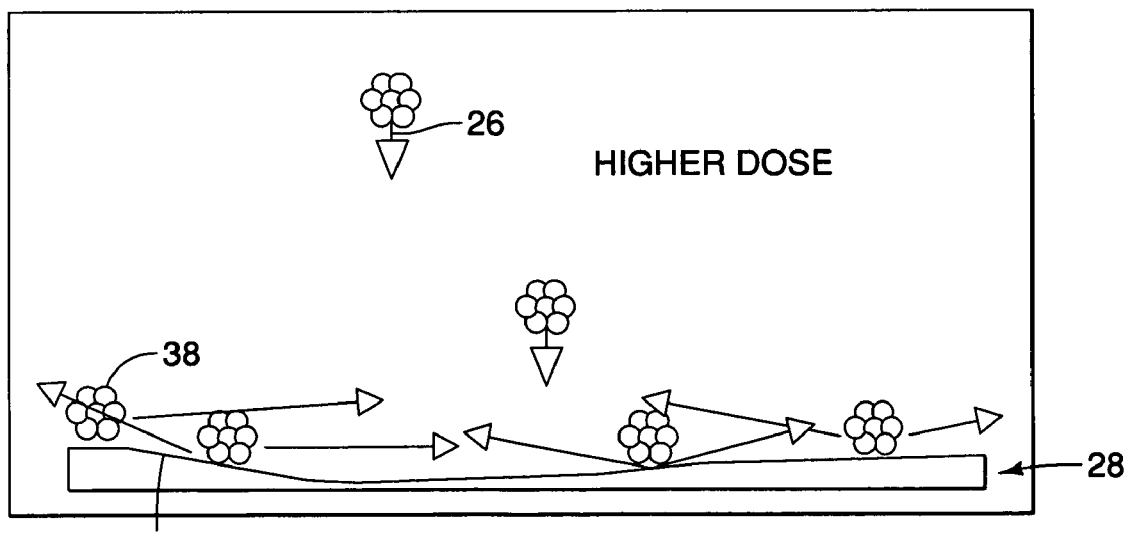

FIGS. 2A and 2B illustrate the effects over time of the GCIB impact of the gas cluster ions 38 of beam 26 upon the surface 36 of the substrate 28 (e.g. diamond) to be polished. From the small amount of energy per atom and the uneven surface 36 of impingement, kinetic simulations have shown that a high lateral sputtering effect takes place. The smoothing mechanism is thought to occur primarily because the nature of the atom clusters prevent back-sputtering by the very fact that their mass impedes such possibility (i.e., one atom immediately behind the initial impinging atom effectively blocks the back sputtering process). In this manner, lateral sputtering takes place from the atoms within the cluster colliding with one another and moving outwards across the surface. In practice, this translates to a rapid erosion of high frequency anomalies and inevitable smoothing (polishing) of the target surface as illustrated in the modified surface morphology between FIGS. 2A and the same substrate after GCIB treatment in FIG. 2B. Variables such as the energy of the gas cluster acceleration, the number of atoms within the gas cluster, the particular gas species, and the charge state of the cluster all contribute to the ultimate impact crater morphology and the surface smoothing or modification process.

Examination of surface roughness both prior to and after a gas cluster ion beam (GCIB) impingement process has shown that diamonds, gemstones, precious metals and other materials can be smoothed using Argon, Argon with some oxidizing gas ($O_2$), and other source gas clusters such as various nitrogen oxides ($NO_x$) and carbon dioxide ($CO_2$). With a low energy configuration, no sub-surface damage has been observed in the surface smoothing process. Additionally, the smoothing process is unaffected by the crystallographic plane of the material being polished, e.g. {100}, {110} and {111} planes can be polished equally to the same degree unlike the anisotropy of mechanical polishing of diamond surfaces. The lateral sputtering effect from the gas cluster impact is a significant factor in the smoothing process. The angular distribution of the surface ejected atoms when the gas cluster ion beam is at normal incidence to the target or substrate is a lateral one, as shown in FIG. 2.

Preferred GCIB processing conditions for single crystal diamonds include the following:

Accelerating voltage: 30 kV

Beam current: 200 μA

Dose: Step 1—1E16 cm$^{-2}$ at 15 keV Ar; Step 2—5E15 cm$^{-2}$ at 5 keV $O_2$.

Processing time: 15 minutes for all diamond that could be loaded on a 200 mm area.

Gas chemistry and processing steps: Ar used for step 1 for polishing, followed by $O_2$ in step 2 for the purpose of removal of angstrom level graphitization. Polishing in step 1 may also be done with the use of Ar in combination with reactive gases.

II. Process Methodology

Some important but not necessarily critical details and methodology described below are:

Holder design to hold diamonds

Heating of the holder to enhance the polishing process

Cleaning of diamonds prior to processing

Using oxidizing gas for processing ($O_2$ or $NO_x$ or $CO_2$ with or without Ar) Using different gas species for gemstones Post processing cleaning step Option: In the case of diamond, include intermetallic chemical-mechanical polishing technique to ensure high surface finish of diamond prior to GCIB processing.

Option: may need Plasma-enhanced chemical etching processing step prior to GCIB processing if the diamonds are not to required level of surface finish as typically the case if conventional grinding/polishing process was used.

Figure 5:
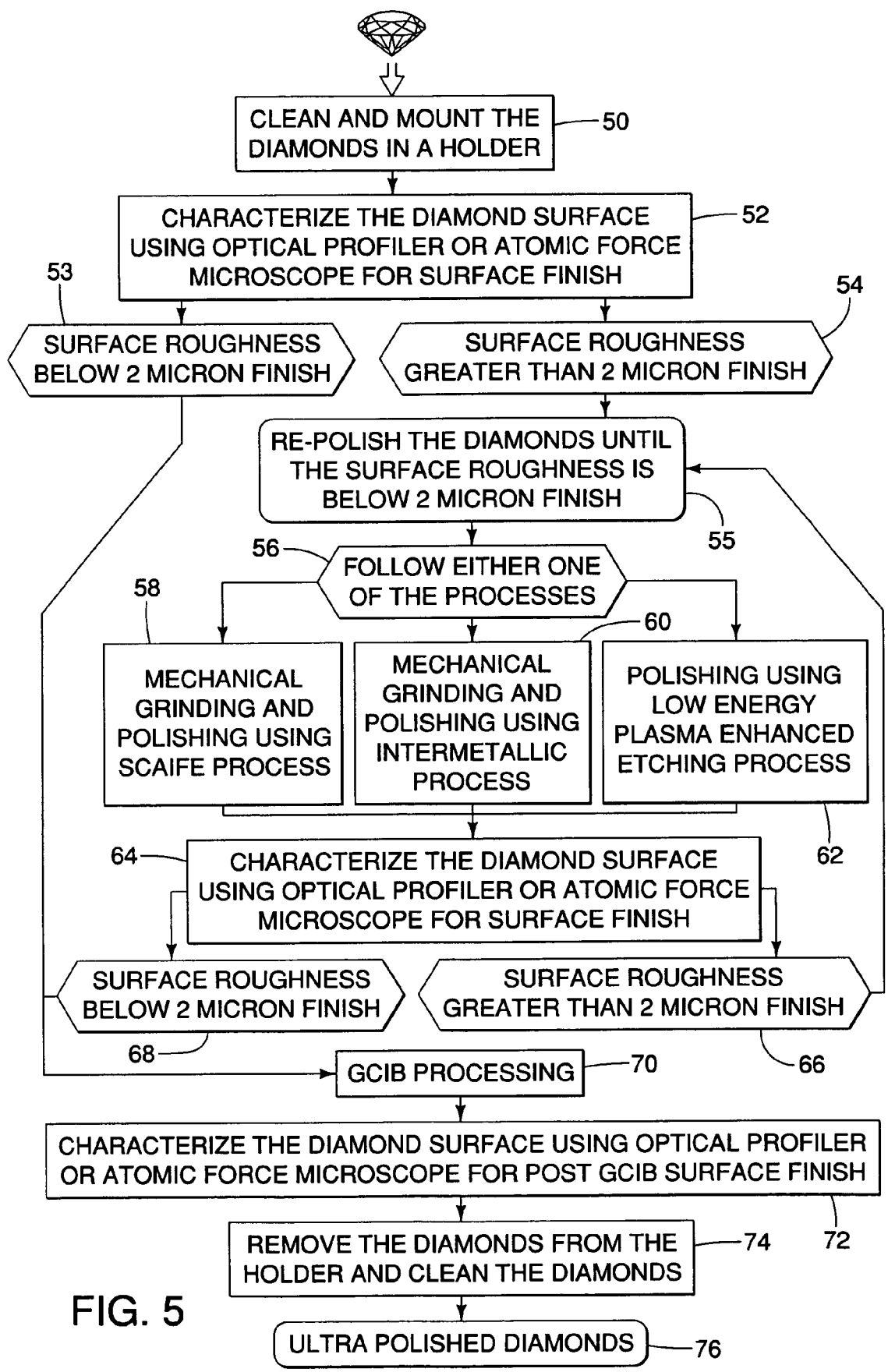
FIG. 5 is a flow chart illustrating methods of the present invention used for polishing gemstones and the like using the devices of FIGS. 1 and 3.
Figure 8:
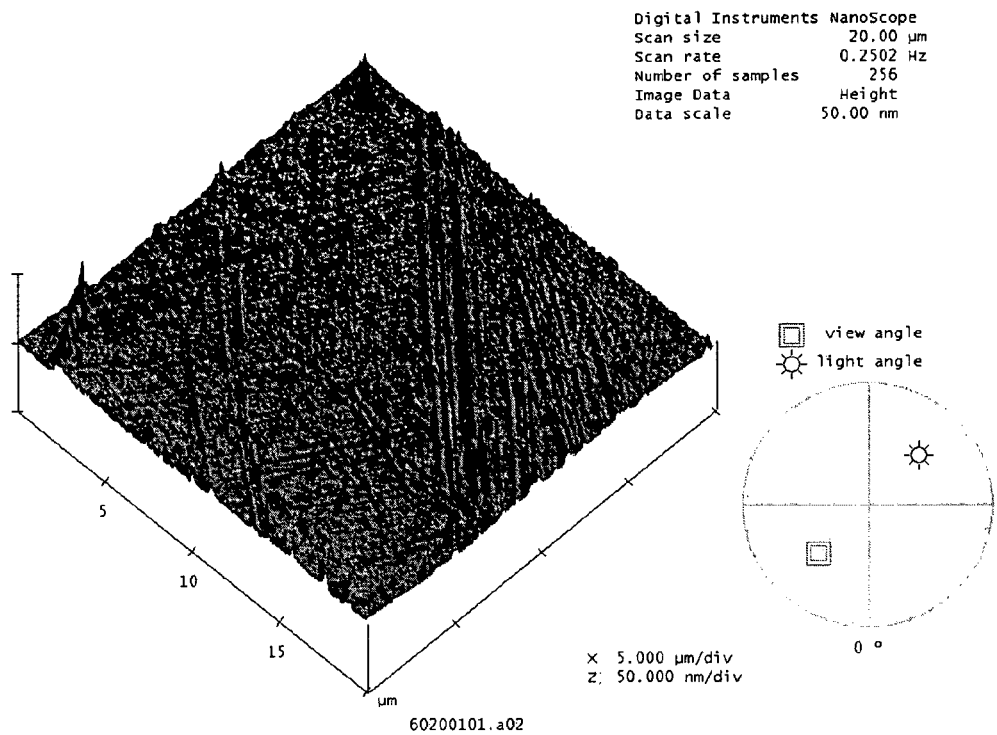
FIG. 8 is a 3-D image taken from an atomic force microscope (AFM) scan of a single crystal diamond surface before applications of GCIB processing according to the invention.
Figure 9:
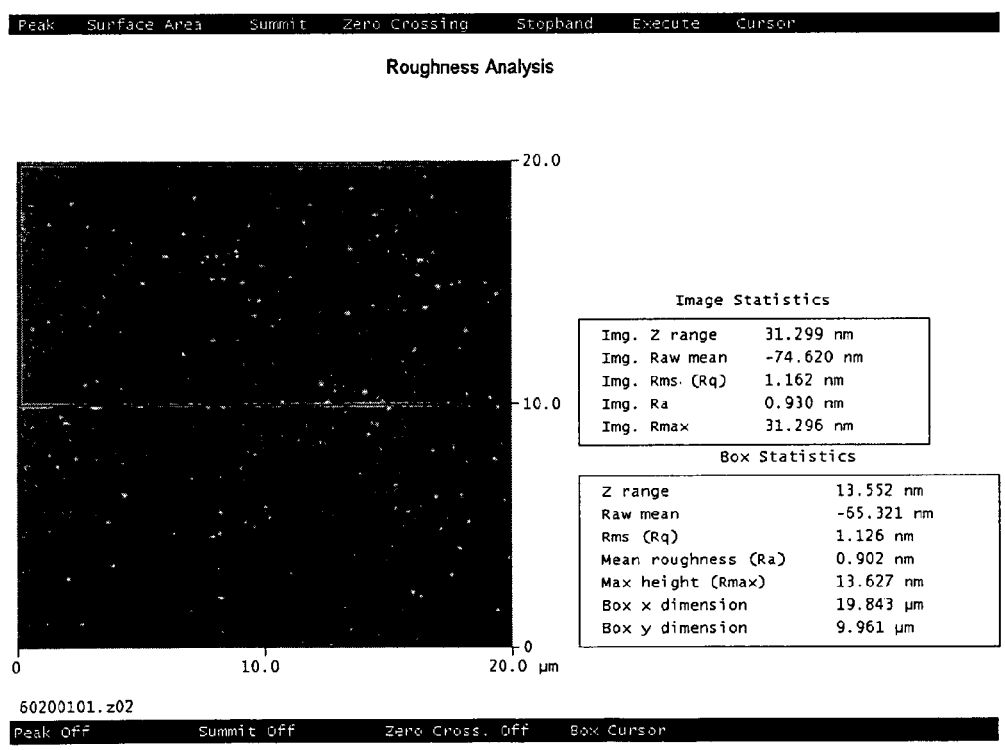
FIG. 9 is an atomic force microscope (AFM) scanned image of the single crystal diamond from FIG. 7 taken after GCIB processing.
Figure 10:
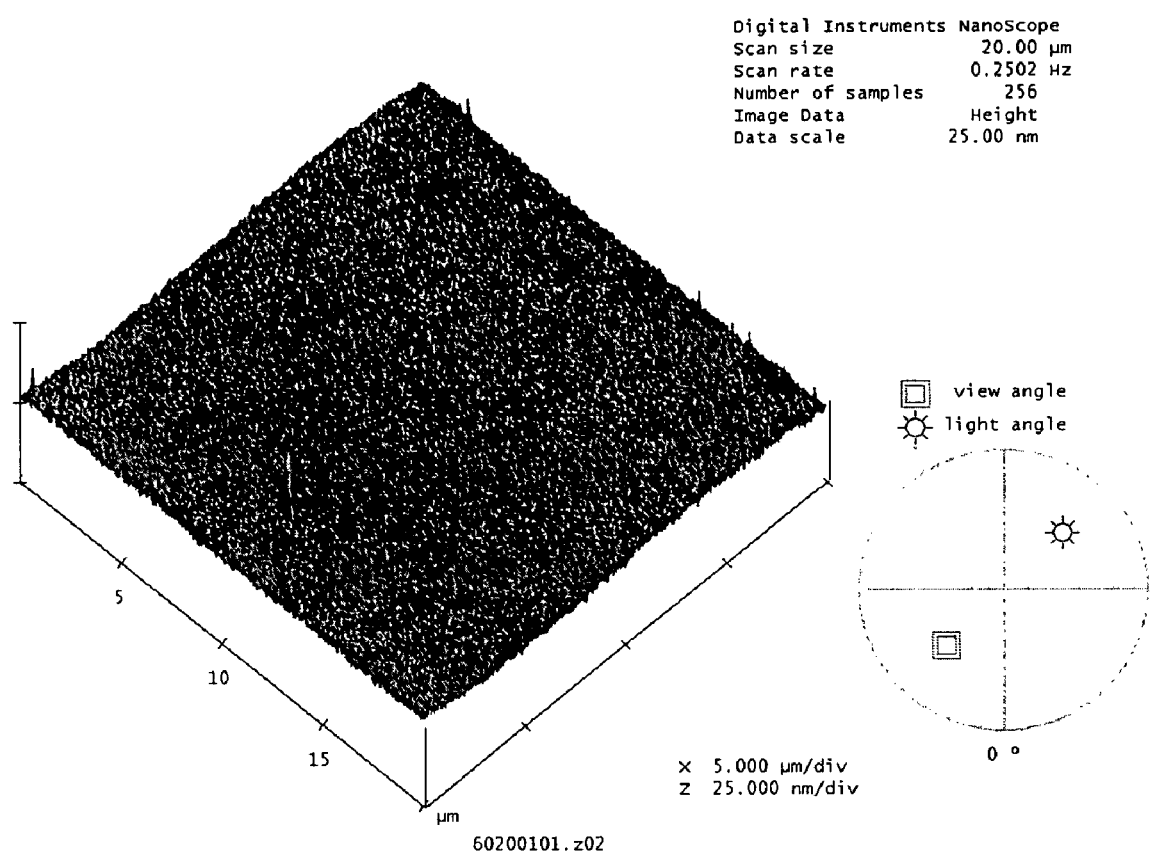
FIG. 10 is a 3-D image taken from an atomic force microscope (AFM) scan of the single crystal diamond surface of FIG. 8 after applications of GCIB processing according to the invention.

Characterization of surface finish using atomic force microscopy (AFM) and/or optical profiling III. Process Flow Step 1: Clean the diamond: The cleaning process can be accomplished by any acceptable process for cleaning diamonds such as immersion in an ultrasonic bath of isopropyl alcohol or other cleaner solutions used in the trade (refer to block 50 FIG. 5). After the cleaning process the diamonds are mounted in a special holder that is designed to hold multiple diamonds and is capable of being heated to high temperatures (up to 800° C.) and is ultra high vacuum compatible.

Step 2: Scan the surface of the diamond using Atomic force microscope (AFM) or Optical profiler in block 52. This step is to mainly record the surface roughness to determine if pre-processing steps are needed prior to GCIB polishing step.

Step 3: If the surface roughness is determined to be beyond the acceptable roughness requirement for the GCIB process in query block 54 (typically the starting roughness should be below 2 microns) the following procedure is followed—otherwise block 53 proceeds to the GCIB step 5 further below:

Polish the diamond in block 55 using any of the following techniques from branch block 56:

1. Grinding and polishing technique in block 58 in which the diamonds are polished with diamond powders intervened between the diamond and a hard cast iron plate rotating at a high speed—currently Scaife technique is used by industry
2. Diamond is polished in block 60 by pushing an intermetallic compound grinder against the diamond while allowing the grinder to rotate or move relative to the diamond and by keeping the portion subjected to polishing at room temperature or preferably between 300-500° C., a temperature for carbide formation that is lower than for other types of grinding wheels. The basic concept of this technique follows below (refer to section IV)
3. Plasma-enhanced chemical etching (PECE) techniques in block 62 for polishing diamond using commercially available tools. The PECE process takes advantage of the ability of atomic oxygen to oxidatively chemically etch diamond surfaces. By generating high-density atomic oxygen plasma with magnetic filtration, the atomic oxygen polishing plasma source provides for a rapid reaction rate between the atomic oxygen plasma and the diamond surface. The density, and accordingly the reaction rate, can be easily controlled by adjusting the gas pressure, the applied discharge power to the plasma source, and the power to the electron source. By restricting the plasma flow to low energy species limits the physical bombardment of the diamond surface by atomic or molecular oxygen ions, a process that results in directional, and accordingly non-uniform, etching of the diamond surface. Under low energy conditions, the primary etching effect on the diamond surface is the non-directional chemical reaction of atomic oxygen with the diamond surface.

Step 4: Scan the surface of the diamond in block 64 using Atomic force microscope (AFM) or Optical profiler. If the surface roughness is still greater than 2 microns, as determined in block 66, then the process again proceeds to block 55 for a re-polish step. It may be necessary to repeat any one of the above mention pre-processing steps 58, 60, or 62 to reduce the GCIB processing time and also for GCIB process to be most effective. If, instead, the surface roughness determined to be less than the specified amount (e.g. 2 microns) in block 68, then the process proceeds to the GCIB step 5 below.

Step 5: GCIB processing step in block 70.

Step 6: After the GCIB processing step scan the surface of the diamond using Atomic force microscope (AFM) or Optical profiler. The final surface roughness and topography is characterized and recorded in block 72.

Step 7: Remove the diamonds from the holder and follow the final clean process in block 74. The final cleaning process can be accomplished by any acceptable process for cleaning diamonds such as immersion in an ultrasonic bath of isopropyl alcohol, thereby yielding the ultrapolished diamonds in block 76. Residual graphitization on the polished surface may be removed by conventional acid boiling procedures wherein the diamond is immersed in a bath of hot oxidizing acid such as sulfuric acid or a mixture of sulfuric acid and nitric acid, for a certain period of time, typically on the order of several hours. Residual graphitization may also be removed by an oxygen plasma (PECE) technique. Here the time period and plasma conditions can be controlled to cause the removal of the graphitized layer without further etch of the polished diamond.

Reference is made to FIG. 6 showing an atomic force microscope (AFM) imaging for GCIB processing data on polycrystalline CVD diamond. FIGS. 7-10 show AFM images before and after GCIB processing of a natural single crystal diamond illustrating the improvement to surface smoothness made by using the polishing process, including GCIB, of the present invention.

IV. Intermetallic-Based Diamond Polishing Background

As described elsewhere in this disclosure, the Scaife method for polishing diamond has still persisted despite the intensive wear of the grinder, frequent re-conditioning of the saife, the fact that the scaife method is a time consuming process, and limitations to ultimate surface finish achievable. In addition to the mechanically induced transformation of $sp^3$ carbon (diamond) to the less dense form of $sp^2$ hybridized carbon for polishing of {100} and {110} planes, and the micro-fracture method for {111} plane, it is also possible to polish diamond by dynamic friction polishing using an abrasive-free, low carbon content, stainless steel wheel rotating at high peripheral speeds leading to material removal via thermo chemical reaction occurring as a result of dynamic friction in atmosphere.

The most serious problem in this method, however, is that an efficient polishing can be achieved only by heating the polishing tool or material to be polishing to high temperatures. Stainless steel and iron-based materials are softened at high temperatures and their strength is markedly deceased, which makes stable polishing impossible.

Polishing must typically be carried out in an evacuated atmosphere or in a reductive atmosphere so as to prevent the iron from being oxidized, especially when using iron at high temperatures. Thus, other problems arise relating to the facilities and to complicating the polishing process (i.e., polishing cannot be carried out freely and easily).

In addition, such high temperature heating as described above affects even the diamond which is the subject of polishing and may cause cracks and fractures in the subject diamond due to the thermal stress caused by an abrupt temperature gradient during fracture and heating.

An attempt has been made to replace iron with chromium and titanium, both of which have a strong affinity with carbon. However, chromium is too brittle to be subjected to polishing, and titanium is too soft and, like iron, easily oxidized to form titanium oxides. Thus, both cannot be used as an abrasive. Laser polishing has also been attempted as an alternative; however, its accuracy of dimension is poor and it is therefore not useable.

V. Process Methodology for Intermetallic-Based Diamond Polishing

Diamond surfaces have been found to react at elevated temperatures with carbide-forming metals, e.g. titanium carbide can form at temperatures as low as 140° C. This concept is utilized in the intermetallic-based diamond polishing wheel proposed here. In this method, carbide-forming metals are used in the material of the grinding wheel in the form of intermetallics consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W. The content of the intermetallic compound in the grinder is 90 percent by volume or greater.

In one embodiment of the invention a grinding wheel composed primarily of Ti and Al with small percentages of one or more elements selected from the group of Mo, Nb, or Hf has been used for intermetallic polishing of the diamond via carbide formation. The intermetallic wheel is pre-heated to approximately 250° C. prior to bringing the diamond into contact with the spinning wheel, this is primarily done to take advantage of the improved toughness of the intermetallic material at elevated temperature in addition to rapidly elevating the temperature of the diamond at the point of contact to the wheel appropriate for efficient carbide formation. In another embodiment of the invention the intermetallic wheel material is composed of Ti and Al in a manner so as to promote specific phase of the intermetallic such as the Gamma-phase. Thermo-mechanical properties of the alloy (strength, ductility, fracture toughness, creep rates and endurance limit) are profoundly affected by the microstructure of the material which is improved by extrusion and annealing. The extrusion process results in destruction/disintegration of the lamellar as-cast microstructure and results in evolution of fine grained microstructure by dynamic recrystallization processes The preparation of the intermetallic wheel (or disc) requires multiple alloy manufacturing process steps. In one embodiment of the invention the intermetallic compound is formed from Ti and Al with various additives. In one embodiment of the invention small amounts of Nb in addition to Gamma-TiAl significantly improves the hardness of the alloy which in turn significantly improves the tensile strength of the material (~1100 MPa). The raw material for the preparation of the wheel may use Ti sponge, Al granules or master alloys prepared from aluminothermic reduction of metal oxides and Al powder followed by vacuum induction melting. The raw material undergoes pressing and vacuum arc re-melting (VAR) or electron beam melting (EBM) or cold hearth plasma arc melting (PAM) or plasma arc skull melting (PASM) to produce the ingots which are machined, encapsulated and then extrusion pressed to produce semi-finished parts. The VAR process or PAM process is preferred for the preparation of the intermetallic material based upon high homogeneity achieved in addition to fine microstructure. The VAR process is preferred over the PAM from the cost factor.

The diamond is polished by pushing the grinder against the diamond while allowing the grinder to rotate or move relative to the diamond. The grinding wheel may be pre-heated to a temperature in the range of approximately 250-350° C. based in part upon the composition and preferred phase of the material. At points where diamond comes into contact with the grinder, TiC, TiAlC, TiAlCN, etc., are formed due to the frictional heat and the heating from outside sources. At the point of contact, the diamond can reach a temperature of between 550-700° C. This causes an intensive chemical polishing, and thereby the polishing of diamond is allowed to progress.

The intermetallic compound polishing grinder does not significantly lose its hardness even at high temperatures, and it has an advantageous property that its hardness increases with temperature until the temperature reaches about 600° C. This technique is proposed to be suitable for polishing diamond because of its relatively small amount of chipping or wearing, and in addition, it has a characteristic of markedly increasing the wear of diamond.

When carrying out polishing and applying heat from outside, a heating temperature range which is particularly effective is 250-350° C. Diamond is heat-affected by the above application of heat to become more reactive with the grinding and polishing tool. Thus, the reaction of diamond (which is essentially carbon in its $sp^3$ hybridized form) with Ti (which may be a component of the intermetallic embedded in the grinder), becomes easier and the carbide formed is easily removed by the mechanical grinding motion of the wheel.

The key concepts and advantages embodied within the preferred polishing grinder are:

- The grinding wheel is composed of an intermetallic compound
- Grinding wheel can be free of any abrasives (diamond powder as used in scaife method)
- Formation of a carbide occurs by the thermo chemical reaction induced by dynamic friction between diamond and intermetallic compound wheel
- Intermetallic compound grinding wheel does not require frequent re-conditioning since there is not the intensive wear and tear typical of the scaife polishing
- Polishing result is independent of the polish plane or direction
- Temperature for carbide formation is lower at 300-500° C. as opposed to the iron carbide formation using a cast-iron or stainless steel wheel Intermetallic compound grinding wheel has improved mechanical properties (hardness, toughness) at elevated temperatures as opposed to iron or steel at elevated temperature.

Among various kinds of intermetallic compounds, there are some kinds which are too brittle to be used for a grinder independently. However, their strength and toughness can be improved by combining them with the materials which can improve strength or toughness or by forming composite intermetallic compounds with other intermetallic compounds. Accordingly, the intermetallic compound which cannot be used independently can be used for a grinder if they take the form as described above.

Figure 3:
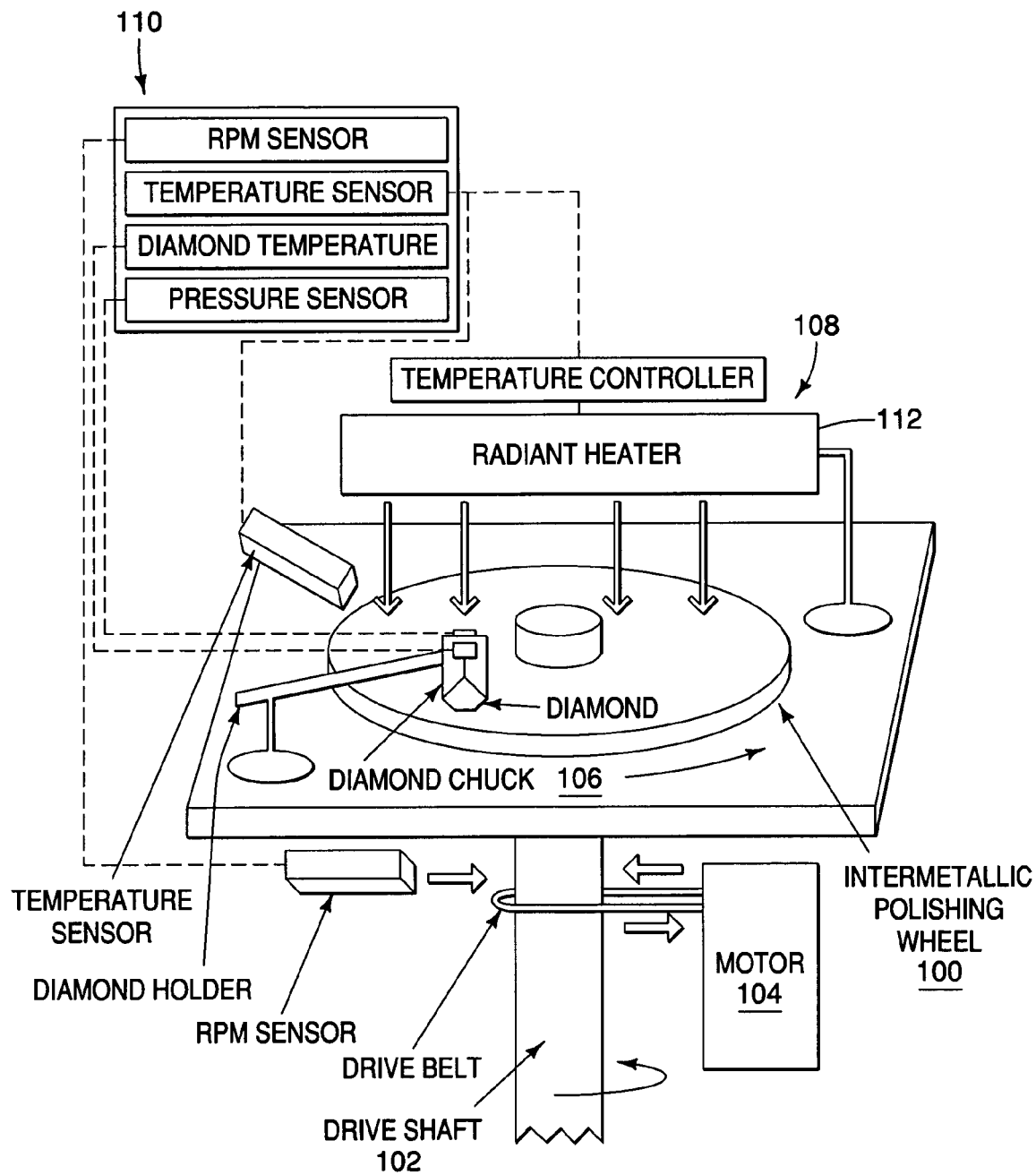
FIG. 3 is a schematic diagram of an intermetallic-based chemical-mechanical polishing apparatus constructed to practice methods of the present invention.
Figure 4:
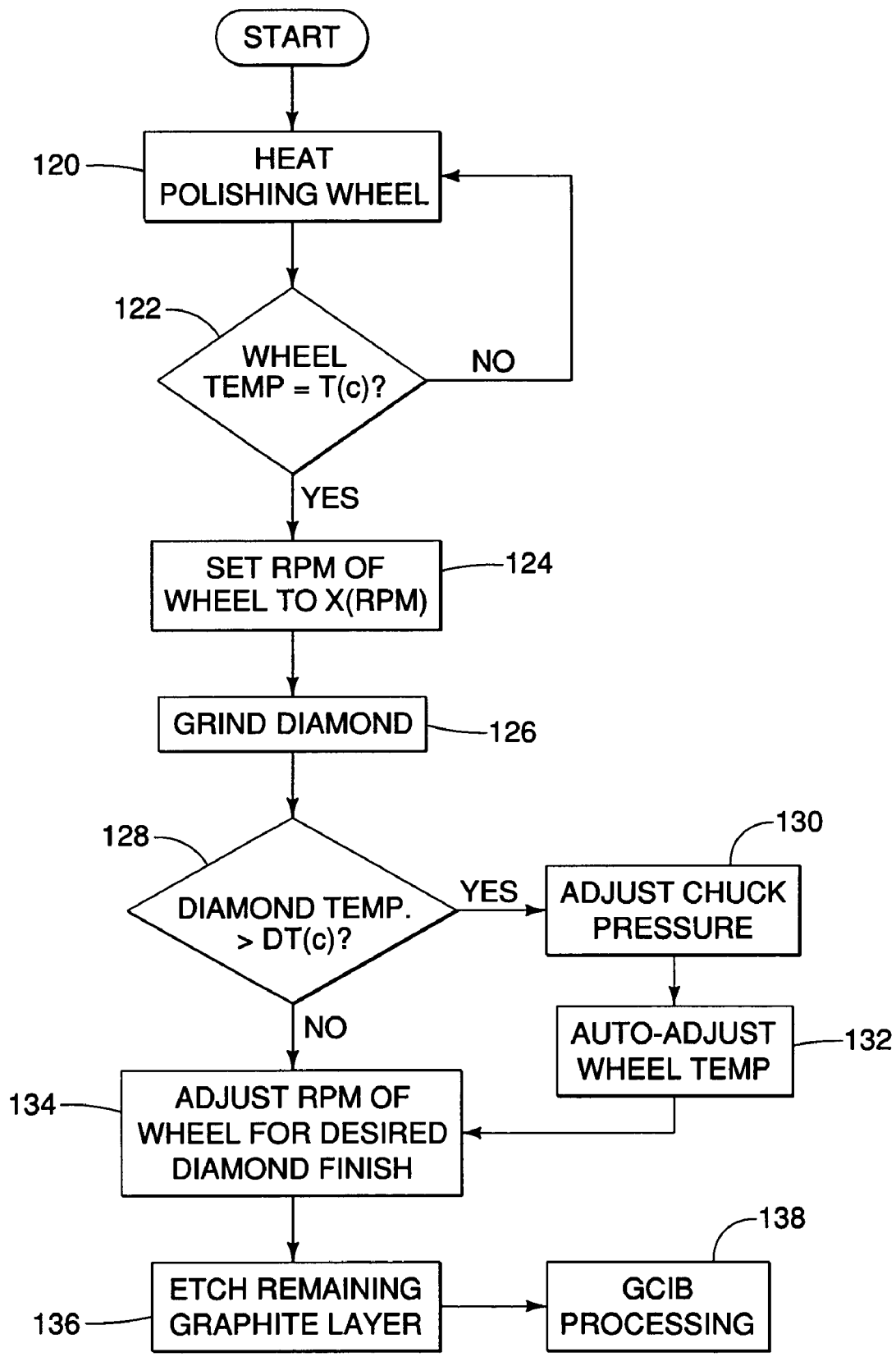
FIG. 4 is a flow chart showing steps to effect chemical-mechanical polishing using the device of FIG. 3 according to methods of the invention.

FIG. 3 shows one embodiment of the apparatus for intermetallic-based chemical-mechanical diamond polishing. The key elements of the apparatus are the intermetallic wheel 100 mounted on a drive shaft assembly 102 that is connected to the motor drive 104, the diamond chuck 106, and the heating assembly 108. Real time feedback is achieved through electronics 110 including a wheel/diamond temperature sensor and a pressure sensor mounted on the diamond chuck 106, and an RPM sensor to monitor the wheel speed. The heating of the wheel can be achieved via different configurations— one of the configurations as shown in the figure is via a radiant heater 112 focused on one half the wheel with a heat shield installed to protect the person working at the wheel. Any other methods for heating the wheel can be implemented including but not limited to heating of the drive shaft to transfer heat via conduction, heating the underside of the wheel using peltier devices or the use of radiant heating as shown in one embodiment of the invention (FIG. 4). The pressure sensor would provide real time feedback to ensure constant pressure at the point of contact between the diamond and the wheel.

FIG. 4 illustrates a typical process flow for carrying out the phase I of the diamond polishing via the chemical-mechanical polishing on the intermetallic wheel apparatus. Included is the process is a heating of the intermetallic grinding wheel in block 120 to preferred temperature T(c). Wheel temperature sensor determines whether the wheel 100 is at T(c) [preferably between about 250-350° C.] and if so, query block 122 proceeds to spinning up wheel 100 to the desired RPM in block 124. If T(c) is not maintained within the preferred range, then further heat adjustment of the wheel 100 through radiant heater 112 is obtained. The diamond holder and diamond chuck 106 is then lowered until the diamond surface to be polished is biased into contact with the intermetallic polishing wheel 100 so that the diamond is ground in block 126. Diamond temperature is sensed through electronics 110 in chuck 106 and query block 128 adjusts the chuck pressure (block 130) and wheel RPM (block 132) if the temperature moves beyond an acceptable range. The desired finish may be obtained by adjusting the RPM of the wheel in block 134. The remaining graphite layer is etched in block 136 and the GCIB process (block 138) started [also block 70 in FIG. 5].

As noted further above, residual graphitization on the polished surface may be removed by conventional acid boiling procedures wherein the diamond is immersed in a bath of hot oxidizing acid such as sulfuric acid or a mixture of sulfuric acid and nitric acid, for a certain period of time, typically on the order of several hours. Residual graphitization may also be removed by oxygen plasma (PECE) technique. Here the time period and plasma conditions can be controlled to cause the removal of the graphitized layer without further etch of the polished diamond.

Figure 11:
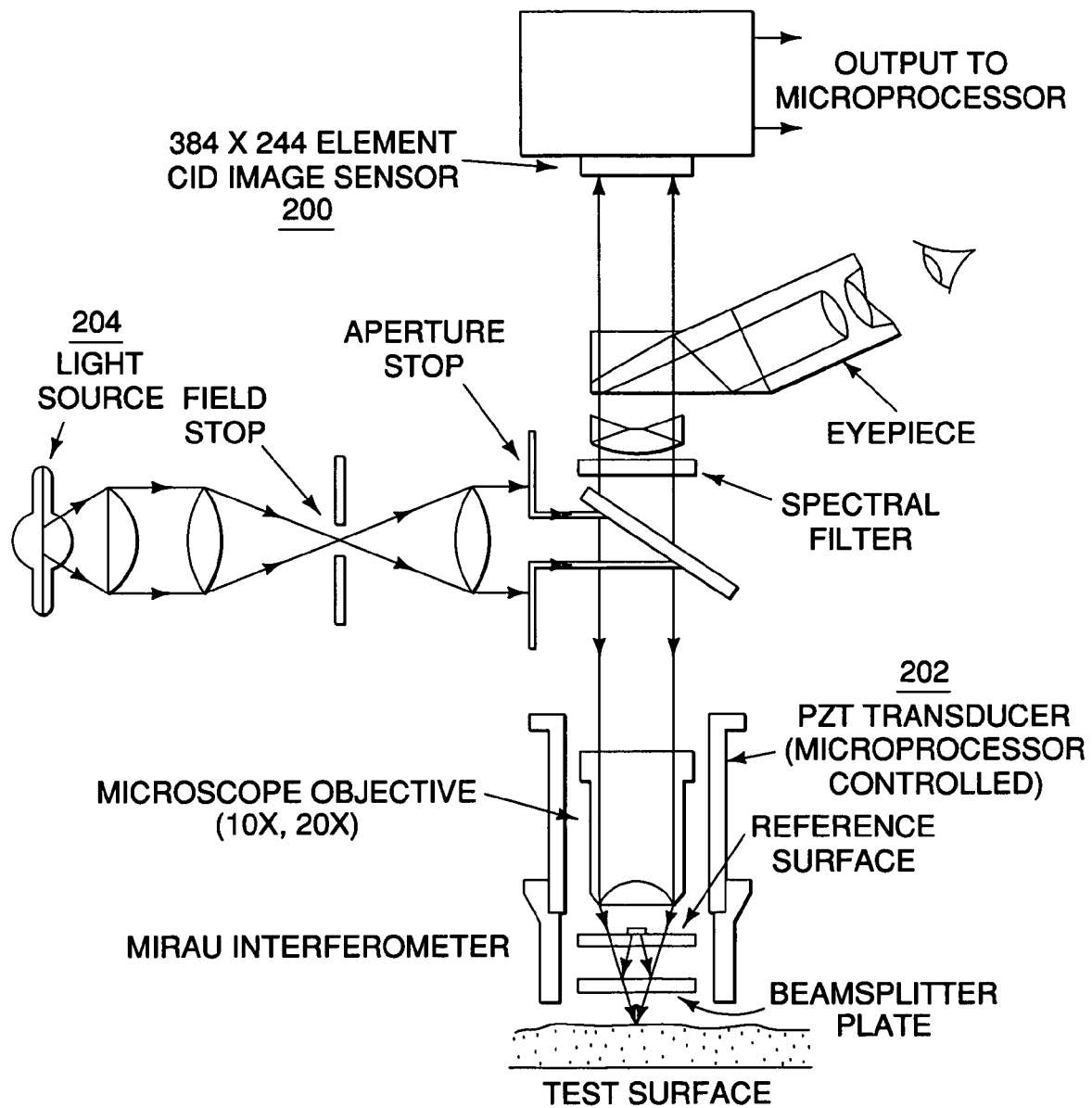
FIG. 11 is a schematic diagram of the three-dimensional digital optical profiler used to carry out an element of the polishing process.

VI. Optical Profiler:

The optical profiler includes a two-beam interferometer (refer to FIG. 11). An interference pattern produced thereby is focused onto an array of photocells in image sensor 200. Phase shift in a reference beam of the interferometer is produced by accelerating a piezoelectric transducer 202 supporting the interferometer mirror to a constant velocity. The velocity is maintained constant for at least 360° of phase shift, during which four integrated buckets are obtained from each photocell. The outputs of the photodetector array are continuously integrated and effectively read out every 90° of phase shift of the reference beam by a computer that computes a first value of phase corresponding to each photocell output from the first, second, and third integrated buckets produced by that photocell and a second phase value from the second, third, and fourth integrated bucket values obtained from that photocell. The two phase values are averaged, eliminating the effects of sinusoidal noise produced by inaccuracies in the reference beam phase at which integrated buckets are initiated and terminated. Data points at which intensity modulation produced by the reference beam phase variation is less than a noise threshold are masked from phase calculations. The intensity of the interferometer light source is automatically controlled by averaging intensity of the interference pattern at angles that differ by 180° to cancel out the effects of the interference and obtain an average intensity. The lamp voltage of light source 204 is automatically adjusted to maintain the average intensity.

TABLE 1

Resolutions of different surface roughness measurement techniques

| Type | Contact or Non-contact | Resolution | |
|---|---|---|---|
| | | Lateral | Vertical |
| Stylus | Contact | 1-2 μm | 5 nm |
| Optical | Non-contact | 1 μm | 0.5-1 nm |
| SEM stereoscopy | Non-contact | 2-4 nm | 10-20 nm |
| Tunneling microscopy | Non-contact | 0.3 nm | 0.02 nm |

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method for polishing an item, wherein the item is a gemstone having multiple crystallogranhic planes to be treated, comprising the steps of:

creating atomic or molecular cluster from a source gas;

ionizing the cluster;

impacting the ionized cluster onto a target surface of the item to be polished so that the cluster breaks apart with high lateral sputtering upon impact to thereby affect the morphology of the target surface; and repeating the creating, ionizing, and impacting steps to increase a polish of the target surface.

2. The method of claim 1, wherein the atomic or molecular cluster includes from 500 to 5000 atoms.

3. The method of claim 2, further including the step of imparting a 5 to 80 keV acceleration to the cluster toward the target surface.

4. The method of claim 1, wherein the gemstone is a diamond.

5. The method of claim 1, wherein the source gas is taken from the group consisting of argon, argon with some oxidizing gas ($O_2$), various nitrogen oxides ($NO_x$), and carbon dioxide ($CO_2$).

6. The method of claim 1, further including the step of creating an atomic or molecular cluster from a second source gas, ionizing the second cluster, and impacting the ionized second cluster onto the target surface of the item to be polished, where the second source gas is different from the first source gas.

7. The method of claim 6, wherein first source gas is Ar and the second source gas is $O_2$.

8. The method of claim 1 wherein multiple clusters are created, the method further including the steps of:
mounting a plurality of diamonds within an impact path for the ionized clusters;
heating the diamonds; and
simultaneously subjecting the heated diamonds to impact from the ionized clusters.

9. The method of claim 8, further including the step of:
scanning the surface of the diamond prior to the impacting step to determine surface roughness of the target surface;
only subjecting the target surface to the impacting step if the determined surface roughness is lower than a predetermined amount, otherwise conducting a pre-polishing step.

10. The method of claim 9, wherein the pre-polishing step includes pushing the target surface against a rotating surface formed of an intermetallic compound.

11. The method of claim 10, wherein the intermetallic compound consists of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W.

12. The method of claim 9, wherein the pre-polishing step includes using a Plasma-enhanced chemical etching (PECE) technique.

13. An apparatus for polishing diamonds and the like comprising:
a gemstone mount positioned within a chamber, said mount adapted for mounting the diamonds therein to expose a target surface;
a gas cluster ion beam (GCIB) device adapted to direct ionized gas clusters within the chamber toward the target surface.

14. The apparatus of claim 13, further including a heater coupled to the gemstone mount for imparting heat to the diamonds mounted therein.

15. The apparatus of claim 13, the GCIB device further including:
a gas source adapted to include one or more gases selected from the group consisting of argon, argon with some oxidizing gas ($O_2$), or various nitrogen oxides ($NO_x$) or carbon dioxide ($CO_2$); and
a Venturi nozzle coupled to the gas source for creating gas clusters of between 500-5000 atoms held together by van der Waals forces; and
an accelerator for imparting an acceleration energy to gas clusters generated by the Venturi nozzle from the gases supplied from the gas source.

16. The apparatus of claim 15, wherein the acceleration energy is between about 5 and 80 keV.

17. An apparatus used for polishing gemstones comprising a grinding wheel having a grinding surface formed of an intermetallic compound consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W.

18. The apparatus of claim 17, wherein the content of the intermetallic compound in the grinder is 90 percent by volume or greater.

19. The apparatus of claim 17, wherein the grinding wheel composed primarily of Ti and Al with small percentages of one or more elements selected from the group of Mo, Nb, or Hf.

20. The apparatus of claim 17, further comprising a heater adapted to preheat the grinding wheel prior to bringing a diamond to be polished into contact with the wheel.

21. A method for manufacturing a grinding wheel for use in polishing gemstones and the like, comprising:
providing raw materials consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W;
forming ingots from the raw materials using an ingot formation process; and
machining the ingots to produce the grinding wheel.

22. The method of claim 21, wherein the step of forming in the ingots from the raw materials includes one selected from the group consisting of pressing and vacuum arc re-melting (VAR), electron beam melting (EBM), cold hearth plasma arc melting (PAM), or Plasma arc skull melting (PASM).

23. The method of claim 22, wherein the step of forming the ingots from the raw materials includes vacuum arc re-melting (VAR).

24. The method of claim 23, wherein the grinding wheel is composed of Ti and Al in a manner so as to promote a Gamma-phase of the intermetallic.

25. A method for polishing a gemstone, comprising:
providing a grinding wheel having a grinding surface formed of an intermetallic compound consisting of one kind or more of elements selected from the group of Al, Cr, Mn, Fe, Co, Ni, Cu, Ru, Rh, Pd, Os, Ir and Pt, and one kind or more of elements selected from the group of Ti, V, Zr, Nb, Mo, Hf, Ta and W; and
contacting a surface of the gemstone to be polished with the grinding surface.

26. The method of claim 25, further including the step of pre-heating the gemstone prior to contact with the grinding surface.

27. The method of claim 26, wherein the step of pre-heating the gemstone includes heating the gemstone to between about 250-350° C.

28. The method of claim 25, wherein the gemstone is a diamond and further including the step of keeping a temperature of the diamond during contact with the grinding wheel at between about 550-700° C.

29. The method of claim 25, further including removing a residual graphitization by an oxygen plasma (PECE) technique.

* * * * *